United States Patent [19]
Wilski et al.

[11] Patent Number: 5,660,639
[45] Date of Patent: Aug. 26, 1997

[54] METHOD AND APPARATUS FOR PLASMA TREATING AN ARTICLE

[75] Inventors: Lawrence F. Wilski, Warren; Michael D. Tisack, Ann Arbor, both of Mich.

[73] Assignee: Ford Motor Company, Dearborn, Mich.

[21] Appl. No.: 544,214

[22] Filed: Oct. 17, 1995

[51] Int. Cl.$^6$ ............................................. C23C 16/00
[52] U.S. Cl. ....................... 118/723 E; 118/728; 118/733
[58] Field of Search .......................... 118/723 E, 728, 118/733; 427/569; 156/345, 643.1; 204/298.07, 298.33

[56] References Cited

U.S. PATENT DOCUMENTS

| | | | |
|---|---|---|---|
| 3,068,510 | 12/1962 | Coleman | 118/723 |
| 3,182,103 | 5/1965 | Blaylock, Jr. et al. | 264/22 |
| 3,196,485 | 7/1965 | Battenfeld et al. | 264/22 |
| 4,107,049 | 8/1978 | Sano et al. | 210/490 |
| 4,134,942 | 1/1979 | Mirr et al. | 264/26 |
| 4,147,745 | 4/1979 | Sano et al. | 264/22 |
| 4,265,730 | 5/1981 | Hirose et al. | 204/298 |
| 4,315,808 | 2/1982 | Imada et al. | 204/169 |
| 4,317,788 | 3/1982 | Imada et al. | 264/22 |
| 4,501,766 | 2/1985 | Suzuki et al. | 427/38 |
| 4,548,867 | 10/1985 | Ueno et al. | 428/409 |
| 4,752,426 | 6/1988 | Cho . | |
| 4,800,053 | 1/1989 | Bauman et al. | 264/83 |
| 4,806,296 | 2/1989 | Brewster | 264/83 |
| 4,830,810 | 5/1989 | Ufer et al. | 264/40.1 |
| 4,839,207 | 6/1989 | Yoshitomi et al. | 428/64 |
| 4,861,250 | 8/1989 | Walles et al. | 425/90 |
| 4,933,123 | 6/1990 | Yoshida et al. | 264/22 |
| 4,948,628 | 8/1990 | Montgomery et al. | 427/39 |
| 5,030,399 | 7/1991 | Walles et al. | 264/83 |
| 5,074,456 | 12/1991 | Degner et al. | 228/121 |
| 5,074,770 | 12/1991 | Graefe | 425/117 |
| 5,110,437 | 5/1992 | Yamada et al. | 204/298.33 |
| 5,124,173 | 6/1992 | Uchiyama et al. | 427/38 |
| 5,227,180 | 7/1993 | Tisack et al. | 425/174 |
| 5,236,636 | 8/1993 | Tisack | 264/22 |
| 5,415,819 | 5/1995 | Tisack | 264/22 |
| 5,439,524 | 8/1995 | Cain et al. | 118/723 E |
| 5,500,256 | 3/1996 | Watabe | 427/579 |
| 5,554,255 | 9/1996 | Karner et al. | 156/643.1 |
| 5,560,777 | 10/1996 | Ahn | 118/723 E |

FOREIGN PATENT DOCUMENTS

| | | |
|---|---|---|
| 233846 | 8/1987 | European Pat. Off. . |
| 0250798 | 1/1988 | European Pat. Off. . |
| 416791 | 3/1991 | European Pat. Off. . |
| 2726691 | 12/1977 | Germany . |
| 3627864 | 4/1987 | Germany . |
| 3933874 | 4/1991 | Germany . |
| 57-37821 | 3/1982 | Japan ............................ 427/569 |
| 57-87431 | 5/1982 | Japan ............................ 427/569 |
| 2-290984 | 11/1990 | Japan ............................ 427/569 |

OTHER PUBLICATIONS

Liebel et al., "Pretreatment of Plastics Surfaces in the Low–Pressure Plasma", Kunststoffe German Plastics, 1987.
Takahashi et al, "Plasma Treatment for Painting Polypropylene Bumper", SAE 850320.
Yasuda, et al, "Effect of Electrodeless Glow Discharge on Polymers", Journal of Applied Polymer Science, vol. 17, pp. 137–152, 1973.
Shepherd, Jr., "Plasma Polymerization of Hexamethyldisiloxane", Plasma Science Technical Notes, Oct., 1987.
Mutel et al, "Treatment of Polymer Surfaces: Development of an Industrial Plasma Process", revue de Physique Appliquee, 25 Oct. 1990, pp. 1019–1023.
USSN 08/429,762, Filed Apr. 27, 1995, "Low Pressure Plasma Treatment of an Article Surface", M. Tisack.

*Primary Examiner*—John Niebling
*Assistant Examiner*—Joni Y. Chang
*Attorney, Agent, or Firm*—Damian Porcari

[57] ABSTRACT

An improved plasma treatment apparatus and method are provided, wherein the flow of ionizable gas across an article surface to be treated is optimized through the use of one or more flow lines having a plurality of distribution orifices therealong. The flow lines closely conform to at least one contour of the article surface.

18 Claims, 2 Drawing Sheets

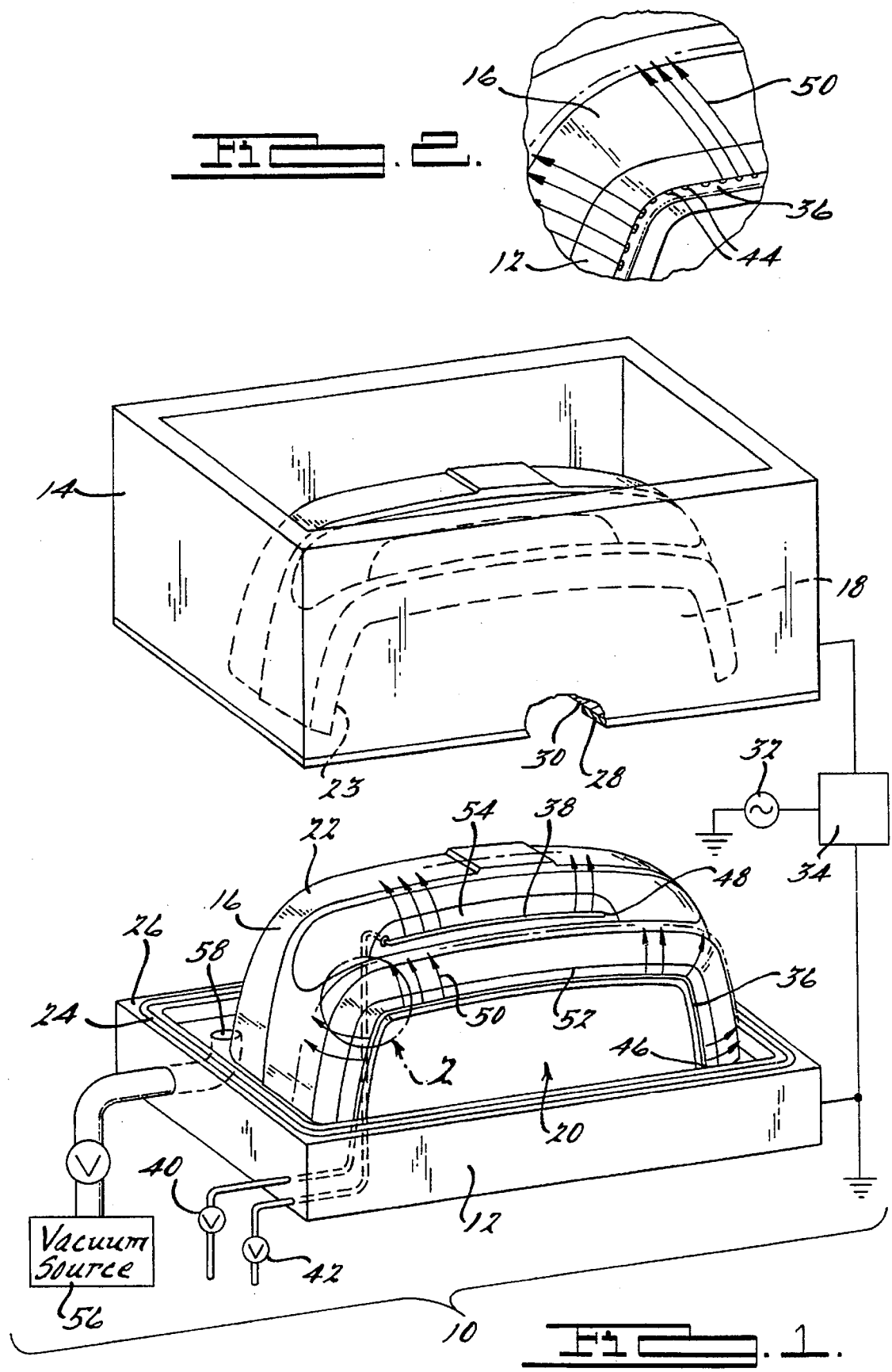

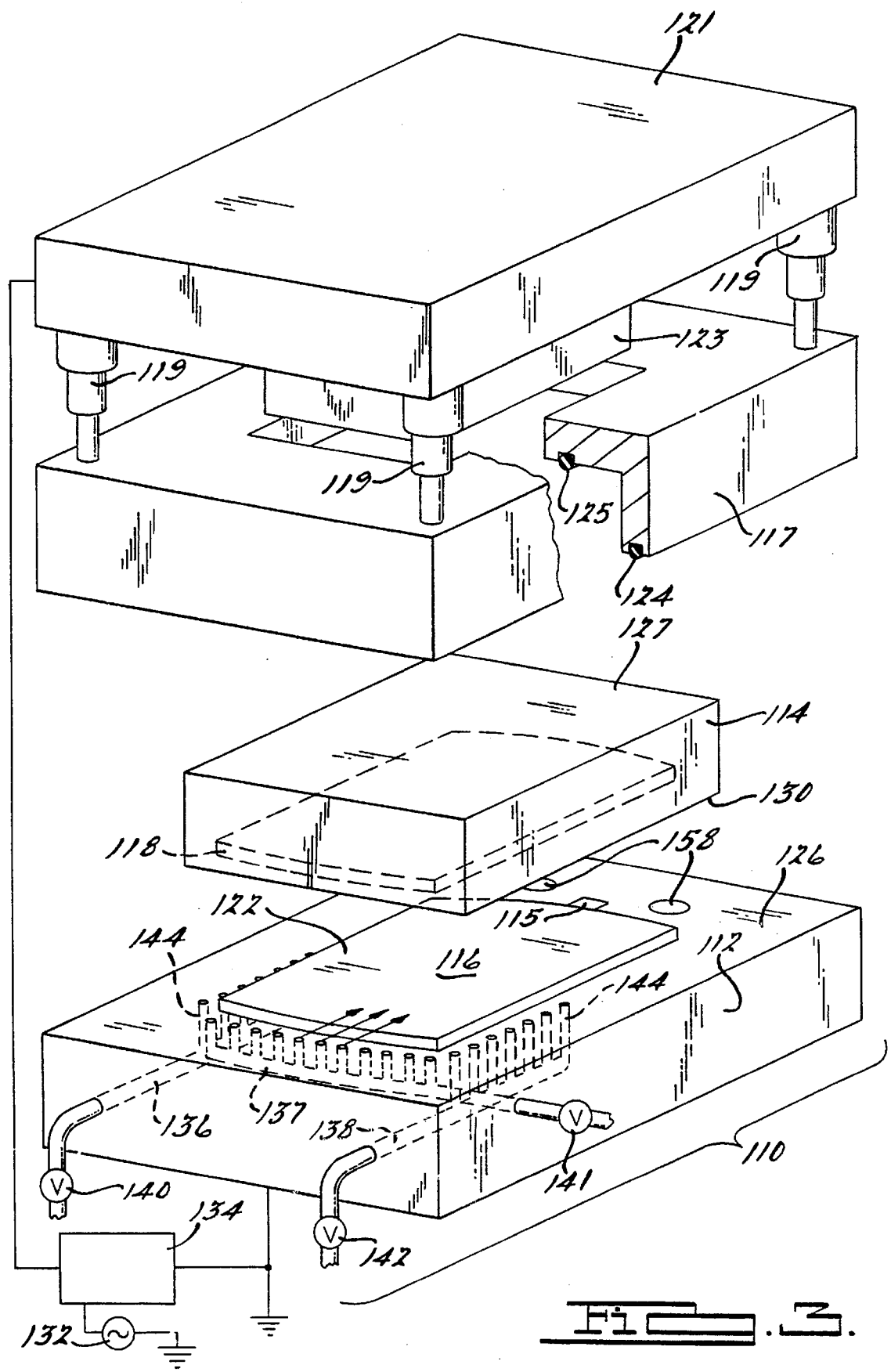

METHOD AND APPARATUS FOR PLASMA TREATING AN ARTICLE

BACKGROUND OF THE INVENTION

1. Field of the Invention

The present invention relates to an apparatus and method for uniformly treating an article with plasma.

2. Description of Related Art

U.S. Pat. Nos. 5,227,180, 5,236,636 and 5,415,819, assigned to the assignee of the present invention and incorporated herein by reference, disclose apparatus and methods for plasma treating an article between two or more electrodes which together form a plasma treatment chamber. These electrode-defined chambers offer several advantages over conventional plasma treatment chambers having discrete electrodes positioned therein. For example, by eliminating the need for a separate chamber to house the electrodes, smaller treatment volumes or spaces may be provided. The treatment spaces may be further reduced by conforming the electrodes to the shape of the article or articles to be treated. These relatively small treatment spaces may be quickly evacuated by low-cost vacuum pumps, decreasing the cycle times and increasing the efficiency of the process relative to conventional plasma treatment processes.

One challenge associated with both conventional plasma treatment processes and the processes taught in U.S. Pat. Nos. 5,227,180, 5,236,636 and 5,415,819 is that of obtaining a uniformly treated article surface. It is possible, using electrode-defined chambers, to create an electric field throughout the treatment chamber. However, because plasma generation requires the presence of both an electric field and an ionizable gas, if the ionizable gas is not sufficiently distributed over an article's surface, the surface will not be uniformly treated. The relatively small treatment volumes and correspondingly rapid treatment times that make the use of electrode-defined chambers desirable, also add to the challenge of achieving a uniform surface treatment. The residence times of ionizable gas molecules within these chambers are shorter than in conventional treatment chambers, limiting the amount of diffusion that can occur. The present inventors have discovered that conventional inlet ports may not provide optimal distribution of the ionizable gas within these electrode-defined chambers.

SUMMARY OF THE INVENTION

The present invention provides an improved apparatus for treating at least one surface of an article with a plasma. The apparatus includes first and second electrically isolated conductive members. These members cooperate to define a chamber for receiving the article. Within the chamber, a treatment space is provided between at least one of the members and the article surface. The apparatus also includes at least one flow line having a plurality of distribution orifices along its length. The at least one flow line closely conforms to at least one contour of the article surface and directs an ionizable gas across the article surface. The apparatus further includes a vacuum source for creating a vacuum in the space. The vacuum source is connected to exhaust ports which communicate with the space and cooperate with the at least one flow line to draw the ionizable gas across the article surface. A high frequency generator is connected between the members for producing an electric field in the space. The members act as electrodes for the electric field. The electric field transforms the ionizable gas into a plasma which reacts with the article surface.

The present invention also provides an improved method for plasma treating at least one surface of an article in a treatment chamber defined by two or more electrically isolated conductive members. The method includes the step of placing the article between the members. The article surface is positioned relative to the members so as to create a small bounded or sealed treatment space between at least one of the members and the article surface. The method also includes the step of providing at least one flow line in fluid communication with the bounded treatment space and closely conforming to at least one contour of the article surface. The flow line has a plurality of distribution orifices along its length. The method further includes the steps of drawing a vacuum in the treatment space and introducing an ionizable gas into the treatment space. The at least one flow line directs the gas across the article surface. The method also includes the step of applying an electric field between the members. The members act as electrodes for the electric field, and the electric field transforms the gas into a plasma which reacts with the article surface.

The improved apparatus and method of the present invention are especially useful for the plasma treatment of articles having complex shapes and surface geometries, ie, multiplanar articles and articles having recessed and highly contoured portions. Such articles can be treated more uniformly with a plasma treatment apparatus having flow lines that conform to the contours of the article surfaces to be treated than with a plasma treatment apparatus having conventional inlet ports.

These and other features and advantages of the present invention will be more fully described below with reference to the following detailed description and drawings.

BRIEF DESCRIPTION OF THE DRAWINGS

FIG. 1 is a partially schematic, exploded perspective view of an apparatus according to the present invention for plasma treating a preformed article.

FIG. 2 is an enlarged view of the area labeled 2 in FIG. 1.

FIG. 3 is a partially schematic, exploded perspective view of an alternative embodiment of an apparatus according to the present invention, adapted to form and plasma treat articles.

DETAILED DESCRIPTION OF PREFERRED EMBODIMENTS

As illustrated in FIG. 1, an apparatus 10 according to the present invention includes a first conductive member 12 and a second conductive member 14. Conductive members 12, 14 together define a treatment chamber for receiving a preformed polymeric article 16, depicted here as a bumper facia for an automotive vehicle. In the illustrated embodiment, article 16 is positioned on conductive member 12. Cavity 18 of conductive member 14 is sized to fit over raised portion 20 of conductive member 12 and article 16, leaving a small treatment space between surface 22 of article 16 and surface 23 of conductive member 14 when members 12, 14 are moved to a closed position. In the closed position, seal 24 provided on shoulder 26 of conductive member 12 abuts against insulator 28 provided on shoulder 30 of conductive member 14, and thereby seals the treatment space between surfaces 22 and 23. Preferably, article 16 and member 14 are positioned such that the distance from article surface 22 to member surface 23 is less than or equal to about 3.0 inches. More preferably, the distance from article surface 22 to member surface 23 is less than or equal to about 2.0 inches; most preferably, the distance is less than or equal to about 1.0 inch. Larger article-to-member distances are of course possible, though less desirable from a cost standpoint.

Apparatus 10 further includes a high frequency generator, such as radio frequency generator 32, for producing an electric field in the treatment space between surfaces 22, 23. Generator 32 is connected between members 12, 14 through impedance matching network 34. Generator 32 and network 34 are generally commercially available systems known to those skilled in the art and typified by model RFX-600 Generator and ATX-600 Tuner manufactured by Advanced Energy Industries, Inc., Fort Collins, Colo. Network 34 matches the impedance of the plasma generated between members 12, 14 to the output of radio frequency generator 32.

Apparatus 10 also includes flow lines 36, 38, illustrated in FIGS. 1 and 2 as discrete tubes. Outside of the treatment chamber, flow lines 36, 38 are connected to an ionizable gas source (not shown) and flow controllers 40, 42. Within the treatment chamber, flow lines 36, 38 are provided with a plurality of distribution orifices 44 (see FIG. 2). Distribution orifices 44 are typically spaced apart a predetermined distance along flow lines 36, 38. In a preferred embodiment, orifices 44 have diameters of between about 0.03 inch and 0.1 inch, and at least one orifice 44 is provided per linear inch of tubing. Ends 46, 48 of flow lines 36, 38 are sealed such that ionizable gas 50 (represented by arrows in FIGS. 1 and 2) is forced through orifices 44 into the treatment space. The inner diameter of each flow line 36, 38 should be sufficiently large in relation to the diameters of the orifices 44 provided thereon, such that gas flow out of the orifices 44 is substantially uniform along the length of the tube.

Within the treatment chamber, flow lines 36, 38 are positioned adjacent article surface 22 and closely conform to the contours thereof. Flow line 36, for example, is provided along an entire edge 52 of article 16, and flow line 38 is positioned within recess 54. The distance between flow lines 36, 38 and article surface 22 is preferably less than or equal to about 2.0 inches, and more preferably less than or equal to about 1.0 inch. Of course, those skilled in the art will understand that flow lines 36, 38 should generally be spaced apart a minimum distance from article surface 22, since the plasma density at orifices 44 may be sufficient to degrade portions of surface 22 positioned very near to the orifices. This minimum spacing is dependent on the orifice size and the flow rate. By conforming flow lines 36, 38 to the shape of article 16 and by further positioning flow lines 36, 38 in close proximity to article 16, flow lines 36, 38 are able to direct the flow of ionizable gas 50 across substantially all portions, including even recessed and highly contoured portions, of surface 22.

Flow controllers 40 and 42 control the flow rate of ionizable gas 50 from flow lines 36 and 38, respectively. Since flow controllers 40, 42 permit individual adjustment of the flow rate of ionizable gas 50 from flow lines 36, 88, the flow of gas 50 across article 16 may be readily optimized. Precise control of the flow rate of ionizable gas 50 is possible using commercially available mass flow controllers known to those skilled in the art, such as the model 2262B mass flow controller manufactured by MKS Instruments, Inc. of Andover, Mass. These mass flow controllers generally comprise a solenoid valve with feedback control provided by the output of a series of fixed temperature heating coils calibrated to the particular ionizable gas being used.

Apparatus 10 further includes a vacuum source 56 connected to at least one exhaust port 58 within the treatment chamber for creating a vacuum in the treatment space. Exhaust port 58 cooperates with flow lines 36, 38 to draw ionizable gas 50 across the contours of article surface 22.

In plasma treating article 16 according to the preferred embodiments of the present invention, article 16 is positioned between conductive members 12, 14 as previously described. Vacuum source 56 evacuates the treatment space sealed by seal 24 to a predetermined pressure between about 0.001–1.0 Torr. The flow rate of ionizable gas 50 into the sealed treatment space is controlled by flow controllers 40, 42, and the total flow rate is between about 100–5000 SCCM. Flow lines 36, 38 distribute the flow of ionizable gas 50 across article surface 22. The flow of ionizable gas 50 into the treatment space is preferably continued throughout the plasma treatment operation to maintain the plasma. Likewise, vacuum source 56 operates throughout the plasma treatment operation to maintain the low (0.001–1.0 Torr) pressure within the treatment space. Exhaust port 58, connected to vacuum source 56, cooperates with flow lines 36, 88 to draw ionizable gas 50 across article surface 22. Generator 32 produces an electric field at a frequency of 13.56 MHz (or multiples thereof) and at a variable power level from 5–3000 W. Conductive members 12, 14 act as electrodes for coupling the electric field in the treatment space. Insulator 28, which is made of a material having a low dielectric loss factor at radio frequencies, electrically isolates conductive members 12, 14. Flow lines 36, 38 are preferably made of a material that is an efficient conductor of high frequency energy, such as copper or aluminum, so that the electric field is not adversely affected by their presence within the chamber. The electric field transforms ionizable gas 50 into a plasma, which reacts with article surface 22.

Depending on the ionizable gas selected, plasma treatment of article 16 may render article surface 22 more receptive to coatings, more permeation resistant, or more abrasion resistant. It is known, for example, to use gases such as $O_2$, $CO_2$, $CO$, $NO_2$, $SO_2$, $NH_3$, $SF_6$, $N_2$, and air, separately or in combination, to render the surfaces of polymeric articles more receptive to coatings such as paints, adhesives, foams and the like. Ionizable gases which are also polymerizable, ie., monomers such as hexamethyldisiloxane, hexamethyldisilazane, tetramethyldisiloxane, tetramethyldisilazane, methylmethacrylate and ethylene, are particularly suited for improving the permeation resistance and abrasion resistance of polymeric articles.

The time required for plasma treatment will generally depend on the type of gas selected, the type of material to be treated, and the power level of the electric field generator. Using the apparatus and method of the present invention, treatment times are preferably less than or equal to about 30 seconds, more preferably less than or equal to about 15 seconds, and most preferably less than or equal to about 10 seconds. Uniform treatment of article surface 22 has even been accomplished in as little as 5 seconds using the apparatus and method of the present invention.

An alternative embodiment of an apparatus 110 according to the present invention is illustrated in FIG. 3. In this embodiment of the invention, apparatus 110 is a forming tool, and conductive members 112, 114 function as dies as well as electrodes. Accordingly, article 116 is formed between members 112, 114 in a cavity 118. Suitable forming methods include injection molding, compression molding, low pressure compression molding, stamping and blow molding. Depending on the forming method selected, apparatus 110 may include resin injecting means, such as tab gate 115, for injecting resin into cavity 118. Integral passages drilled within conductive member 112 define flow lines 136, 137, 138, and distribution orifices 144, which operate in substantially the same manner as the flow lines and distribution orifices described above with reference to FIGS. 1 and 2. Apparatus 110 further includes a radio frequency generator 132, an impedance matching network 134, flow controllers 140, 141, 142 and exhaust ports 158 such as those previously described.

The method of plasma treating article 116 within apparatus 110 is similar to the method described above for plasma treating article 16, except that following the forming of article 116, a treatment space must be created between at least one surface of article 116 and one of the conductive members 112, 114. In the illustrated embodiment, apparatus 110 is provided with a sleeve member 117 for creating this space. Sleeve member 117 is located intermediate a platen 121 and conductive member 112. Platen 121 is secured to conductive member 114 through a central portion 123 (attachment not shown in exploded view drawing). Sleeve member 117 is connected to pistons 119, which operate to extend and retract sleeve member 117 relative to platen 121.

The operation of sleeve member 117 is similar to that described in commonly owned U.S. Pat. No. 5,227,180. That is, during the forming of article 116, sleeve member 117 is in a retracted position, and shoulder 130 of member 114 seals against shoulder 126 of member 112. Orifices 144, which communicate with shoulder 126, are normally sealed by shoulder 130 during the forming operation. Following the forming operation, sleeve member 117 is extended a predetermined distance through the action of pistons 119. In its extended position, sleeve member 117 separates conductive members 112, 114, thereby forming a treatment space between article surface 122 and conductive member 114. Sleeve member 117 contains a pair of seals 124, 125, and is adapted to seal the periphery of the treatment space. Seal 124 seals against shoulder 126 of conductive member 112, while seal 125 seals against upper edge 127 of conductive member 114. Orifices 144 are positioned such that they communicate with the sealed treatment space when sleeve member 117 is in the extended position.

Plasma treatment within the treatment space created between article surface 122 and conductive member 114 is accomplished as described above.

While the invention has been shown and described in its preferred embodiments, it will be clear to those skilled in the arts to which it pertains that many changes and modifications may be made thereto without departing from the scope of the invention. For example, while distribution orifices 44 are positioned in a linear pattern along flow line 36 in FIG. 2, other configurations are possible and will be readily apparent to those skilled in the art. Such modifications which fall within the true scope of this invention are intended to be included with the terms of the appended claims.

What is claimed is:

1. An apparatus for treating at least one surface of an article with a plasma, comprising:

first and second electrically isolated conductive members, said members cooperating to define a chamber for receiving said article wherein a treatment space is provided between at least one of said members and said article surface;

at least one flow line having a plurality of distribution orifices along its length for directing an ionizable gas across said article surface, said flow line closely conforming to at least one contour of said article surface, and at least a portion of said at least one flow line is positioned within a recess in said article;

a vacuum source connected to at least one exhaust port for creating a vacuum in said space, said at least one exhaust port communicating with said space and cooperating with said at least one flow line to draw said ionizable gas across said article surface; and a high frequency generator connected between said members for producing an electric field in said space, said members acting as electrodes for said electric field, said electric field transforming said ionizable gas into a plasma which reacts with said article surface.

2. The apparatus of claim 1, further comprising at least one flow controller for controlling the flow rate of said ionizable gas from said at least one flow line.

3. The apparatus of claim 1, comprising a plurality of flow lines, each of said flow lines having a flow controller for individually controlling the flow rate of said ionizable gas therefrom.

4. The apparatus of claim 1, wherein said at least one flow line is positioned adjacent said article surface.

5. The apparatus of claim 4, wherein the distance between said at least one flow line and said article surface is less than or equal to about 2.0 inches.

6. The apparatus of claim 1, wherein said at least one flow line is provided along substantially an entire edge of said article surface.

7. The apparatus of claim 1, wherein said at least one flow line comprises a discrete tube within said treatment chamber.

8. The apparatus of claim 7, wherein said discrete tube is made of a material selected from the group consisting of copper and aluminum.

9. The apparatus of claim 1, wherein at least one of said members has a surface closely conforming to said article surface.

10. The apparatus of claim 1, wherein said treatment chamber is configured to receive a plurality of articles.

11. The apparatus of claim 1, wherein said conductive members are dies and said at least one flow line and distribution orifices are defined by integral passages provided in one of said dies.

12. The apparatus of claim 11, further comprising means for injecting a resin between said dies.

13. A method of plasma treating at least one surface of an article in a treatment chamber defined by two or more electrically isolated conductive members, comprising the steps of:

placing said article between said members, said article surface positioned relative to said members so as to create a small, bounded treatment space between at least one of said members and said article surface;

providing at least one flow line in fluid communication with said treatment space and closely conforming to at least one contour of said article surface, said at least one flow line having a plurality of distribution orifices along its length;

drawing a vacuum in said treatment space;

introducing an ionizable gas into said treatment space, said at least one flow line directing said gas across said article surface, and into a recessed portion of said article surface;

applying an electric field between said members, said members acting as electrodes for said electric field, said electric field transforming said gas into a plasma; and reacting said plasma with said article surface.

14. The method of claim 13, further comprising the step of providing at least one flow controller, said flow controller controlling the flow rate of ionizable gas from said at least one flow line.

15. The method of claim 13, further comprising the step of providing a plurality of flow lines, each of said flow lines having a flow controller for individually controlling the flow rate of ionizable gas therefrom.

16. The method of claim 13, wherein said placing step comprises forming said article between said members, said members acting as dies as well as electrodes.

17. The method of claim 16, wherein said step of providing at least one flow line comprises providing drilled passages within one of said dies, said passages defining said at least one flow line and said distribution orifices.

18. The method of claim 16, wherein said placing step further comprises separating said dies after forming said article to create said treatment space between said at least one member and said article surface.

* * * * *